United States Patent [19]

Cavaliere et al.

[11] 3,795,828

[45] Mar. 5, 1974

[54] MONOLITHIC DECODER CIRCUIT

[75] Inventors: Joseph R. Cavaliere, Hopewell Junction, N.Y.; Donald B. Mooney, Northbrook, Ill.

[73] Assignee: International Business Machines Corporation, Armonk, N.Y.

[22] Filed: Mar. 8, 1973

[21] Appl. No.: 339,234

Related U.S. Application Data

[63] Continuation of Ser. No. 124,387, March 15, 1971, abandoned.

[52] U.S. Cl.......... 307/303, 317/235 D, 317/235 Z, 317/235 AE

[51] Int. Cl............................................ H01l 19/00

[58] Field of Search..... 307/303, 299 A; 317/235 D

[56] References Cited

UNITED STATES PATENTS 3,587,052 6/1971 Metcalf.............................. 307/303

3,753,005 8/1973 Bertram et al..................... 317/235

*Primary Examiner*—Jerry D. Craig

*Attorney, Agent, or Firm*—Martin G. Reiffen

[57] ABSTRACT

A monolithic decoder circuit provides a decode function with driving capabilities at opposite ports and requires only a single layer of metallization. The circuit comprises a plurality of gates each including a pair of transistors formed by emitter diffusions in a base area. Current switches are connected to the emitters of the transistors to provide inputs and emitter followers are connected to the bases of the transistors to provide outputs.

18 Claims, 8 Drawing Figures

MONOLITHIC DECODER CIRCUIT

CROSS-REFERENCE TO RELATED APPLICATION

This application is a continuation of our prior co-pending application Ser. No. 124,387 filed Mar. 15, 1971 and entitled "Monolithic Decoder Circuit" and to be abandoned Mar. 15, 1973, now abandoned.

BACKGROUND OF THE INVENTION

1. Field of the Invention

The present invention relates to decoder circuits. These are employed to select one line out of a plurality of lines, depending upon the particular combination of input signals.

The present invention also relates to monolithic integrated circuits. In this technology a plurality of transistors and resistors are formed in a single unitary integral silicon chip.

2. Description of the Prior Art

Decoder circuits utilizing discrete components, as distinguished from monolithic structures, are well known in the prior art. The latter also included decoder circuits in monolithic form. However, the prior art did not include monolithic decoders using only a single layer of metallization and with driving capabilities at opposite ports.

SUMMARY OF THE INVENTION

It is therefore a primary object of the present invention to provide a novel monolithic decoder circuit having only a single layer of metallization, thereby resulting in a simpler and more economical structure.

Another object is to provide a novel monolithic decoder having substantially idential driving output ports at opposite sides.

Other objects and advantages of the present invention are either inherent in the structure disclosed or will be readily apparent to those skilled in the art as the detailed description proceeds in connection with the accompanying drawings.

DESCRIPTION OF THE PREFERRED EMBODIMENTS

Figure 1:
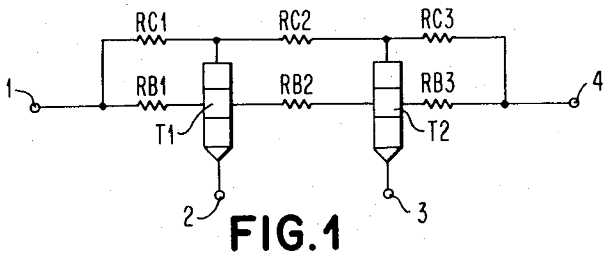
FIG. 1 is a schematic circuit diagram of one of the four gate circuits.

Referring to the drawings in more detail, there are shown two embodiments of a decoder embodying the present invention. Although in actual practice one is more likely to utilize a one out of 16 or one out of 32 decoder, there is disclosed in the drawing a one out of four decoder for purposes of simplicity and clarity in illustration.

Figure 2:
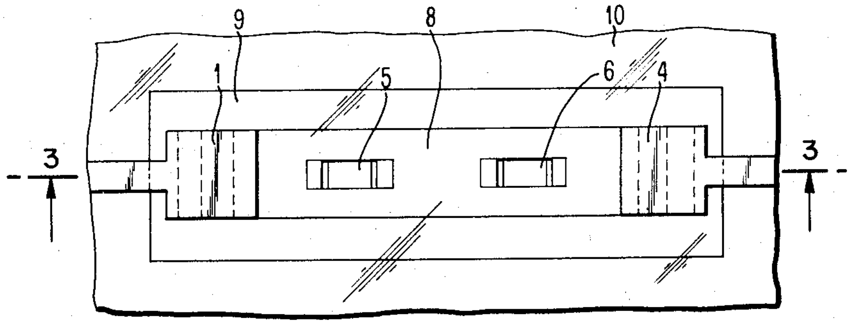
FIG. 2 is a horizontal plan view of the gate circuit with the metallization removed, except for the output metallization.
Figure 3:
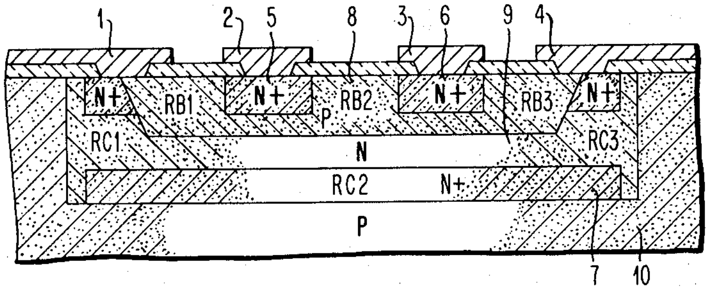
FIG. 3 is a vertical sectional view taken substantially on line 3—3 of FIG. 2.

Referring first to FIGS. 1 to 3, there are shown the schematic circuit diagram and actual construction of one of the four gate circuits. The inputs are at terminals 2 and 3, and the outputs are at terminals 1 and 4. The transistors T1 and T2 are intrinsic and are formed under the emitter diffusions 5 and 6. The resistors RC1, RC2 and RC3 are the resistances encountered going from the N+ surface contact 1 down and through the N+ subcollector 7 and then back out of the N+ surface contact 4 on the other side of the device. The resistor RC1 is that portion from terminal 1 to the intrinsic collector of transistor T1; resistor RC2 is the portion from the intrinsic collector of transistor T1 to the intrinsic collector of transistor T2; and resistor RC3 is that portion from the intrinsic collector of transistor T2 to the surface collector contact terminal 4.

The resistors RB1, RB2, and RB3 are the resistances encountered going from the base contact terminal 1 through the base diffused P region 8 to the terminal 4. The resistor RB1 is from the terminal 1 to the intrinsic base of transistor T1; resistor RB2 is from the intrinsic base of transistor T1 to the intrinsic base of transistor T2; and resistor RB3 is from the intrinsic base of transistor T2 to the output terminal 4. At the terminals 1 and 4 metal connects the N+ surface diffusion to the P base diffusion contact.

As shown in FIG. 3, emitters 5,6 are diffused within a base area 8 overlying an epitaxial layer 9 in turn overlying the subcollector 7. The substrate is shown at 10.

Figure 4:
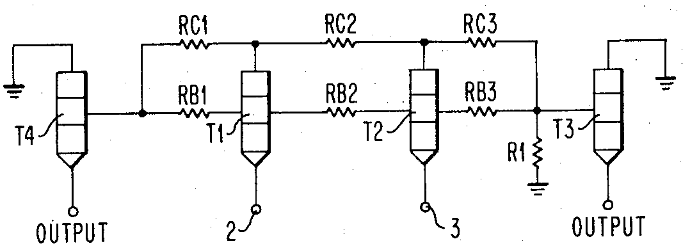
FIG. 4 is a schematic circuit diagram of the gate together with emitter followers at the outputs.

FIG. 4 depicts the gate schematic with a resistor R1 connected at one end and transistors T3 and T4 connected at opposite ends in an emitter-follower arrangement. The input terminals 2 and 3 can be driven from current mode circuits as will be described below. However, voltage mode circuits for driving terminals 2 and 3 can also be employed if desired.

Figure 5:
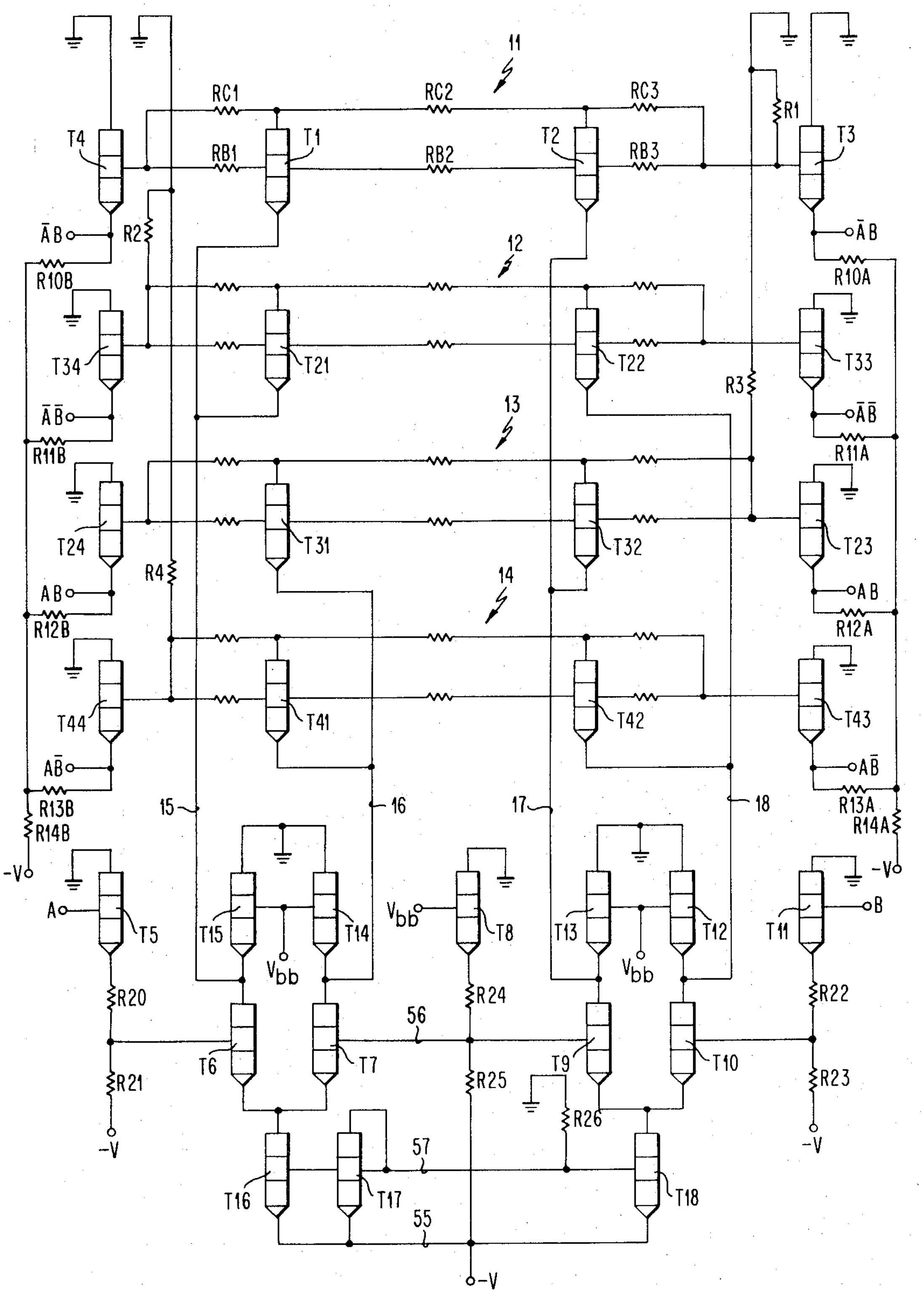
FIG. 5 is a schematic circuit diagram of one embodiment of a decoder circuit in accordance with the present invention.

Referring now to FIG. 5, there is shown the circuitry for a one out of four decoder circuit in accordance with the present invention. The reference numerals 11, 12, 13, 14 refer generally to the four gate circuits as shown in FIGS. 1 to 4. The emitters of transistors T1 and T21 are connected to lead 15; the emitters of transistors T31 and T41 are connected to lead 16; the emitters of transistors T2 and T32 are connected to lead 17; and the emitters of transistors T22 and T42 are connected to lead 18. Lead 15 is connected to the collector of transistor T6; lead 16 is connected to the collector of transistor T7; lead 17 is connected to the collector of transistor T9; and lead 18 is connected to the collector of transistor T10.

One of the two input terminals is designated A at the base of transistor T5. The latter has a resistor R20 connected from its emitter to the base of transistor T6. A resistor R21 extends from the base of the latter to the potential source —V.

The other input terminal designated B is at the base of transistor T11 having its emitter connected by resistor R22 to the base of transistor T10. A resistor R23 extends from the base of transistor T10 to the potential source —V.

The collectors of transistors T5 and T11 are grounded as shown. Transistor T16 functions as a current source for the current switch comprising transistors T6 and T7. Transistor T18 similarly acts as a current source for the current switch comprising transistors T9 and T10. The bases of transistors T16 and T18 are regulated by transistor T17.

The emitters of transistors T16, T17 and T18 are connected to the lead 55 in turn connected to a potential source −V. Also connected to the latter is the lower end of a resistor R25 having its upper end connected to the lead 56 extending to the bases of transistors T7 and T9. The resistor R24 extends from lead 56 to the emitter of transistor T8 having its collector grounded and its base connected to a bias potential source $V_{bb}$. The bases of transistors T16, T17 and T18 are connected to a lead 57 in turn connected to the lower ends of a resistor R26 having its upper end connected to ground.

The transistors T12, T13, T14 and T15 are clamping transistors for the collector of T10, T9, T7 and T6, respectively. For example, with T6 conducting its collector can drop to a voltage level that is a $V_{be}$ below the reference voltage $V_{bb}$. When this occurs T15 will conduct and keep the voltage at the collector of T6 from dropping further. Thus, T6 is kept out of saturation and the down level to the gate devices is always the same and controlled.

The mode of operation of the circuit of FIG. 5 is as follows. Assume that up level signals are applied to the input terminals A and B. The potentials of the bases of transistors T5, T11 are therefore at an up level. The potentials of the emitters of transistors T5, T11 follow the potentials of the bases of these transistors and therefore at an up level. Up level potentials are thereby applied to the bases of transistors T6, T10 to raise the potentials of the bases of these transistors sufficiently above the potentials of the respective emitters of transistors T6, T10 to turn the latter on. The potentials of the emitters of transistors T6, T7, T9, T10 follow the potentials of the bases of transistors T6, T10. The potentials of the emitters of transistors T7, T9 are thereby raised sufficiently with respect to the fixed potentials of the bases of transistors T7, T9 to render the latter nonconductive. This provides potentials at an up level at the collectors of transistors T7, T9 thereby raising the potentials of leads 16, 17 and the emitters of diode-connected transistors T31, T32 sufficiently with respect to the potentials of the bases of diode-connected transistors T31, T32 to render the latter substantially nonconductive. This allows the potentials of the bases and collectors of transistors T31, T32 and hence also the bases of transistors T23, T24 to rise to an up level. The potentials of the emitters of transistors T23, T24 follow the potentials of the respective bases of these transistors and are therefore at an up level. The output terminals of gate 13 are therefore at an up level. It will thus be seen that transistors T5, T11 function as conventional emitter-followers, that transistors T6, T7 function as a conventional current switch as disclosed in U.S. Pat. No. 2,964,652, that transistors T9, T10 also function as a conventional current switch, the transistors T31, T32 function as a logic gate, and that transistors T23, T24 functionas conventional emitter-followers. In a similar manner, it will be seen the emitters of transistors T3 and T4 are raised to an up level in response to the signal $\overline{AB}$; an up level will appear at the emitters of transistors T33, T34 in response to an input signal $\overline{AB}$; and that an up level signal will appear at the emitters of transistors T43, T44 in response to an input signal of $A\overline{B}$.

Figure 6:
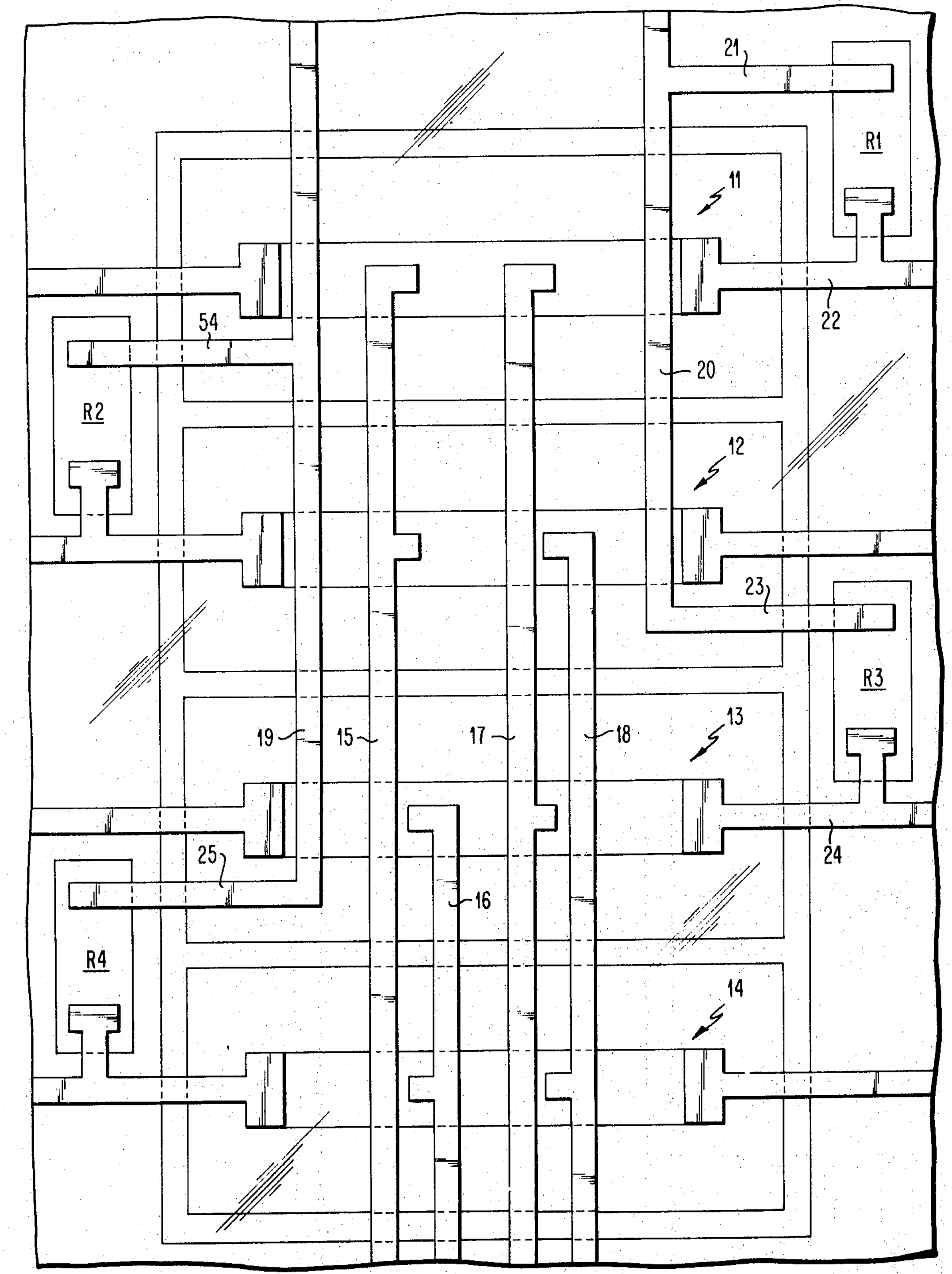
FIG. 6 is a horizontal plan view of the decoder circuit of FIG. 5, without the driver circuits.

Referring now to FIG. 6, there is shown the physical layout of the circuitry shown in FIG. 5. Leads 15, 16, 17 and 18 extend transversely and horizontally over the gate circuits 11, 12, 13, 14. Extending parallel to leads 15, 16, 17, 18 are a pair of ground busses 19, 20. Extending from lead 20 at the upper end thereof is a lead 21 going to the upper end of a load resistor R1. The lower end of load resistor R1 is connected to a lead 22 extending to the base of transistor T3 (not shown in FIG. 6). Similarly, a lead 23 extends from the lower end of lead 20 to the upper end of a load resistor R3. The lower end of the latter is connected to lead 24 extending to the base of transistor T23 (not shown in FIG. 6). A lead 54 extends from the intermediate portion of lead 19 to the upper end of a load resistor R2 having its lower end connected to the base of transistor T34 (not shown in FIG. 6). Extending from the lower end of lead 19 is a lead 25 extending to the upper end of load resistor R4 having its lower end connected to the base of transistor T44 (not shown in FIG. 6).

Figure 7:
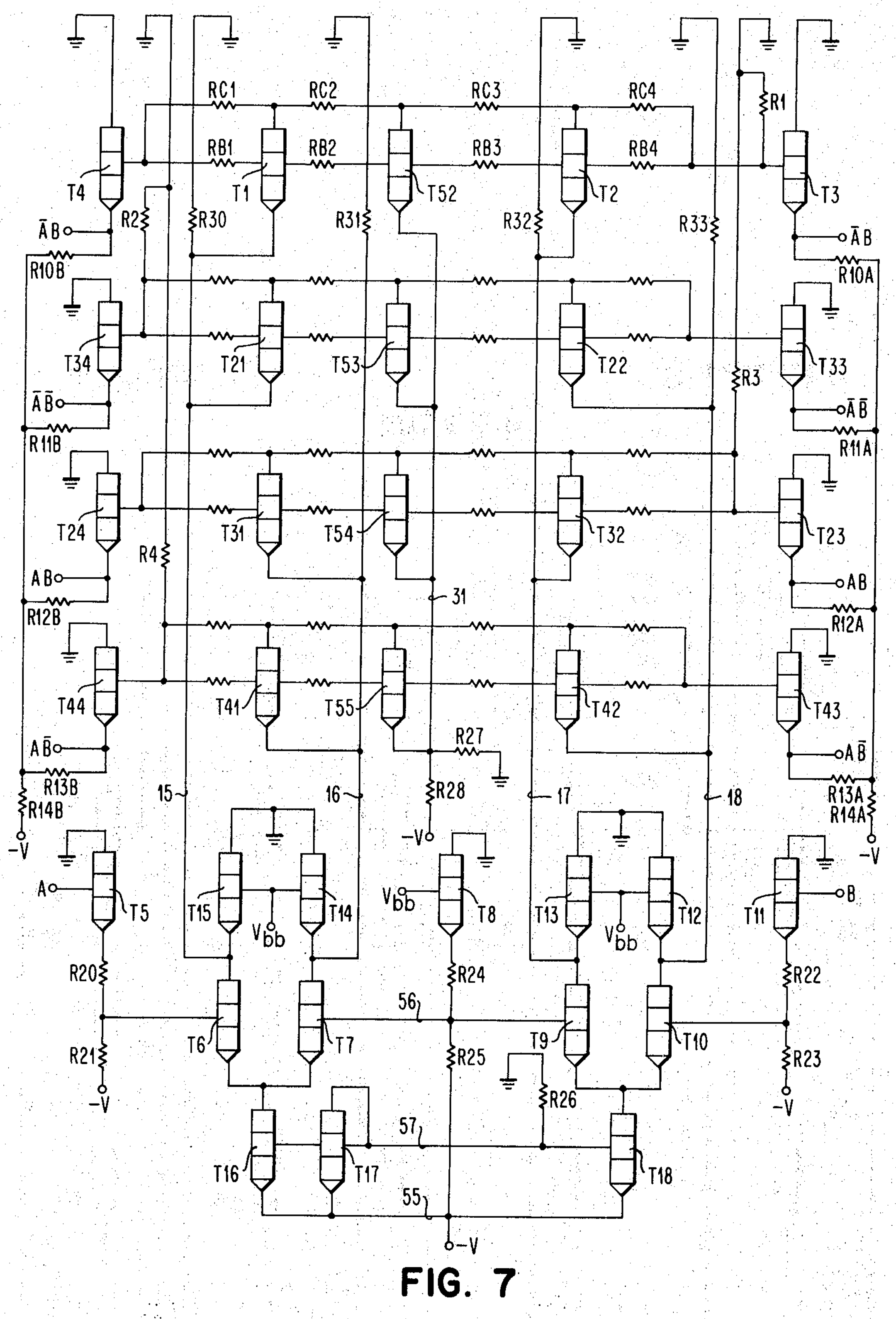
FIG. 7 is a schematic circuit diagram of a second embodiment of the invention.
Figure 8:
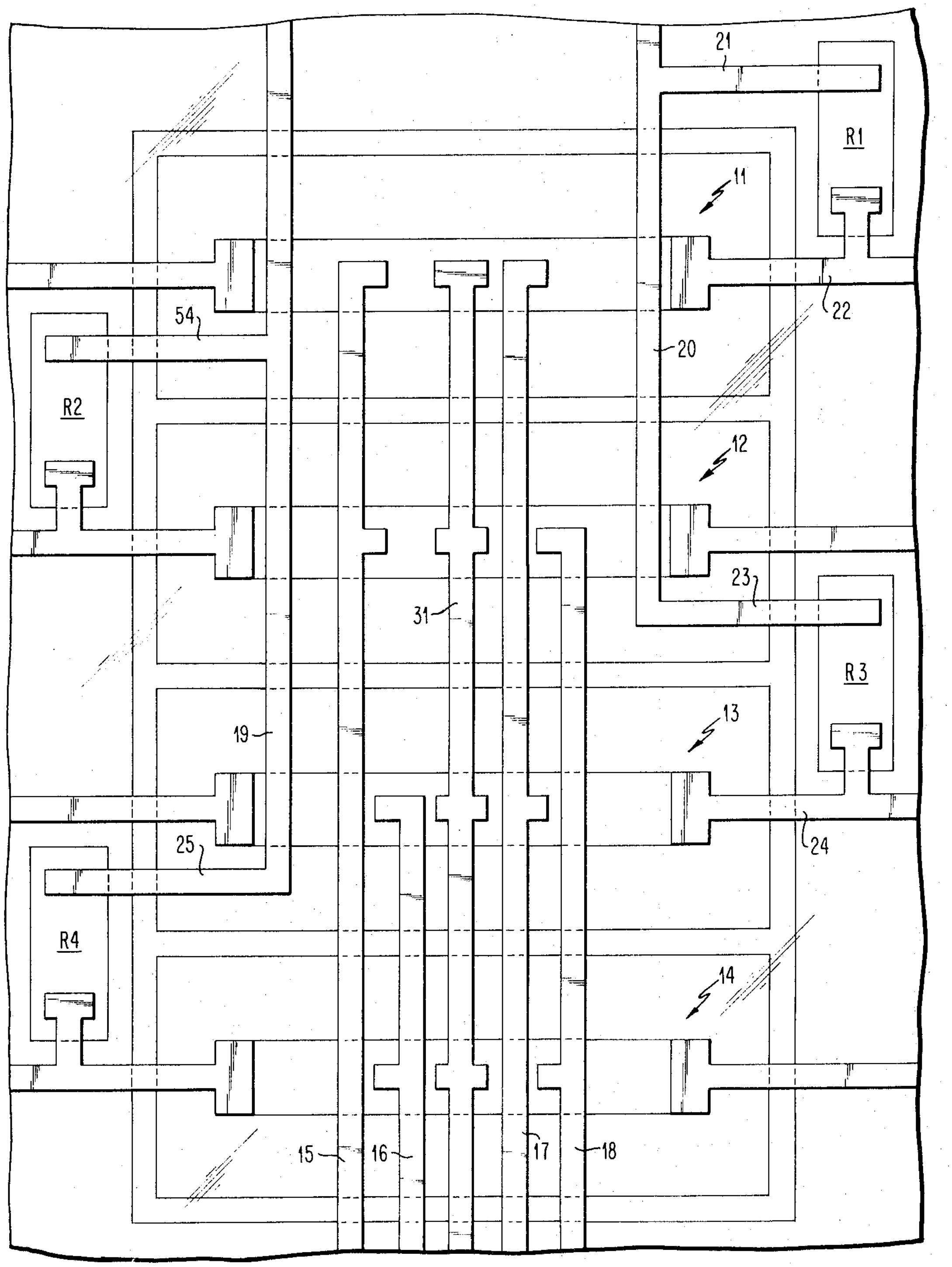
FIG. 8 is a horizontal plan view of the decoder circuit of FIG. 7, without the driver circuits.

Referring now to FIG. 7 there is shown an improvement wherein an additional emitter diffusion is added to each gate thereby forming transistors T52, T53, T54, T55. The emitters are connected together to lead 31 and returned to a voltage source which provides clamping of the "up" level. The clamping voltage is taken off at the junction of resistors R27, R28. This provides a technique for accurately controlling the up level without requiring the up level to be limited to ground potential as in FIG. 5. Furthermore, pull-up resistors R30, R31, R32, R33 are added to leads 15, 16, 17, 18 to speed up the rise time for the positive transition. FIG. 8 shows the horizontal outline of the four gates with the clamping emitter diffusions in the center of the devices.

It is to be understood that the specific embodiments disclosed herein are merely illustrative of two of the many forms which the invention may take in practice and that numerous modifications thereof will readily occur to those skilled in the art without departing from the scope of the invention delineated in the appended claims which are to be construed as broadly as permitted by the prior art.

We claim:

1. In a monolithic integrated decoder circuit in the form of an integral semiconductor chip including a plurality of first mutually-spaced semiconductor portions of a first conductivity type.

a plurality of second semiconductor portions of a second conductivity type and each located within a respective one of said first portions, each of said second portions having therein a plurality of emitter regions of said first conductivity type, each of said first portions comprising a plurality of mutually-spaced collector regions therein, each of said second portions comprising a plurality of mutually-spaced base regions therein with each base region separated from a respective collector region by a first P-N junction and separated from a respective emitter region by a second P-N junction, whereby each first portion and the respective second portion therein and the respective emitter regions within said respective second portion constitute a row of transistors, the improvement comprising:

a plurality of metal conductors each in ohmic contact with both a respective first portion and the respective second portion located within said respective first portion, and a plurality of subcollector regions of said first conductivity type and having an impurity concentration greater than that of said first portions and each located within a respective first portion and in conductive contact with the collector regions within said respective first portion, the collector regions of each row of transistors being connected to each other through relatively low resistance paths within the respective subcollector region, the collector region of at least one transistor of each row being connected to the respective metal conductor through a path within said first portion, the base regions of each row of transistors being connected to each other through paths within the respective second portion, the base region of at least one transistor of each row being connected to the respective metal conductor through a path within said respective second portion, whereby the collector regions of the transistors of each row are connected to the base regions of the transistors of said row through semiconductive paths and the respective metal conductor so as to prevent said transistors from saturating and thereby to prevent saturation effects from delaying the switching operation of said transistors.

2. A monolithic integrated decoder circuit as set forth in claim 1 wherein each of said first portions and the respective second portion therein extend longitudinally, each metal conductor being in contact with one end of the respective first portion and with one end of the respective second portion, a second plurality of metal conductors each in ohmic contact with both the opposite end of a respective first portion and the opposite end of the respective second portion located within said respective first portion, a first plurality of output means each connected to a respective one of said first-recited metal conductors connected to said one ends of said first and second portions, and a second plurality of output means each connected to a respective one of said second plurality of metal conductors, whereby each row of transistors of said decoder circuit is provided with driving capabilities at opposite ends thereof.

3. A monolithic integrated decoder circuit as set forth in claim 2 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

4. A monolithic integrated decoder circuit as set forth in claim 3 wherein said output means comprise a plurality of emitter-follower transistors each having a base and an emitter, means connecting each of said metal conductors to the base of a respective one of said emitter-follower transistors, a plurality of outputs, and means connecting each of said emitter-follower transistor emitters to a respective one of said outputs.

5. A monolithic integrated decoder circuit as set forth in claim 1 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

6. A monolithic integrated decoder circuit as set forth in claim 1 wherein said output means comprise a plurality of emitter-follower transistors each having a base and an emitter, means connecting each of said metal conductors to the base of a respective one of said emitter-follower transistors, a plurality of outputs, and means connecting each of said emitter-follower transistor emitters to a respective one of said outputs.

7. In a monolithic integrated decoder circuit in the form of an integral semiconductor chip including a first semiconductor portion of a first conductivity type, a second semiconductor portion of a second conductivity type and located within said first portion, said second portion having therein a plurality of emitter regions of said first conductivity type, said first portion comprising a plurality of mutually-spaced collector regions therein, said second portion comprising a plurality of mutually-spaced base regions therein with each base region separated from a respective collector region by a first P-N junction and separated from a respective emitter region by a second P-N junction, whereby said first portion and the second portion therein and the emitter regions within said second portion constitute a row of transistors, the improvement comprising:

a metal conductor in ohmic contact with both said first portion and said second portion, and a subcollector region of said first conductivity type and having an impurity concentration greater than that of said first portion and located within said first portion and in conductive contact with the collector regions within said first portion, the collector regions of said row of transistors being connected to each other through relatively low resistance paths within the subcollector region, the collector region of at least one transistor of the row being connected to the metal conductor through a path within said first portion, the base regions of the row of transistors being connected to each other through paths within the second portion, the base region of at least one transistor of each row being connected to the metal conductor through a path within said second portion, whereby the collector regions of the transistors of the row are connected to the base regions of said transistors through semiconductor paths and the respective metal conductor so as to prevent said transistors from saturating and thereby to prevent saturation effects from delaying the switching operation of said transistors.

8. A monolithic integrated decoder circuit as set forth in claim 7 wherein said first portion and the second portion therein extend longitudinally, said metal conductor being in contact with one end of the first portion and with one end of the second portion, a second metal conductor in ohmic contact with both the opposite end of the first portion and the opposite end of the second portion, a first output means connected to said first-recited metal conductor connected to said one ends of said first and second portions, and a second output means connected to said second metal conductor, whereby said row of transistors of said decoder circuit is provided with driving capabilities at opposite ends thereof.

9. A monolithic integrated decoder circuit as set forth in claim 8 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

10. A monolithic integrated decoder circuit as set forth in claim 9 wherein said output means comprise a plurality of emitter-follower transistors each having a base and an emitter, means connecting each of said metal conductors to the base of a respective one of said emitter-follower transistors, a plurality of outputs, and means connecting each of said emitter-follower transistor emitters to a respective one of said outputs.

11. A monolithic integrated decoder circuit as set forth in claim 7 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

12. A monolithic integrated decoder circuit as set forth in claim 7 wherein said output means comprise a plurality of emitter-follower transistors each having a base and an emitter, means connecting each of said metal conductors to the base of a respective one of said emitter-follower transistors, a plurality of outputs, and means connecting each of said emitter-follower transistor emitters to a respective one of said outputs.

13. In a monolithic integrated decoder circuit in the form of an integral semiconductor chip including a plurality of first mutually-spaced semiconductor portions of a first conductivity type, a plurality of second semiconductor portions of a second conductivity type and each located within a respective one of said first portions, each of said second portions having therein a plurality of emitter regions of said first conductivity type, each of said first portions comprising a plurality of mutually-spaced collector regions therein, each of said second portions comprising a plurality of mutually-spaced base regions therein with each base region separated from a respective collector region by a first P-N junction and separated from a respective emitter region by a second P-N junction, whereby each first portion and the respective second portion therein and the respective emitter regions within said respective second portion constitute a row of transistors, the improvement comprising:

a plurality of conductive means each connecting a respective first portion and the respective second portion located within said respective first portion, and a plurality of subcollector regions of said first conductivity type and having an impurity concentration greater than that of said first portions and each located within a respective first portion and in conductive contact with the collector regions within said respective first portion, the collector regions of each row of transistors being connected to each other through relatively low resistance paths within the respective subcollector region, the collector region of at least one transistor of each row being connected to the respective conductive means through a path within said first portion, the base regions of each row of transistors being connected to each other through paths within the respective second portion, the base region of at least one transistor of each row being connected to the respective conductive means through a path within said respective second portion, whereby the collector regions of the transistors of each row are connected to the base regions of the transistors of said row through semiconductive paths and the respective conductive means so as to prevent said transistors from saturating and thereby to prevent saturation effects from delaying the switching operation of said transistors.

14. A monolithic integrated decoder circuit as set forth in claim 13 wherein each of said first portions and the respective second portion therein extend longitudinally, each conductive means being in contact with one end of the respective first portion and with one end of the respective second portion, a second plurality of conductive means each connecting the opposite end of a respective first portion and the opposite end of the respective second portion located within said respective first portion, a first plurality of output means each connected to a respective one of said first-recited conductive means connected to said one ends of said first and second portions, and a second plurality of output means each connected to a respective one of said second plurality of conductive means, whereby each row of transistors of said decoder circuit is provided with driving capabilities at opposite ends thereof.

15. A monolithic integrated decoder circuit as set forth in claim 14 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

16. A monolithic integrated decoder circuit as set forth in claim 15 wherein said output means comprise a plurality of emitter-follower transistors each having a base and an emitter, means connecting each of said conductive means to the base of a respective one of said emitter-follower transistors, a plurality of outputs, and means connecting each of said emitter-follower transistor emitters to a respective one of said outputs.

17. A monolithic integrated decoder circuit as set forth in claim 13 and comprising a plurality of inputs for signals to be decoded, a plurality of current switches each including a pair of transistors each having a collector and having an emitter of one transistor of the pair coupled to the emitter of the other transistor of the pair, means connecting said inputs to said current switches, and means connecting said current switch transistor collectors to said emitter regions.

18. A monolithic integrated decoder circuit as set forth in claim 13 wherein said output means comprise a plurality of emitter-follower transistors each having a base and an emitter, means connecting each of said conductive means to the base of a respective one of said emitter-follower transistors, a plurality of outputs, and means connecting each of said emitter-follower transistor emitters to a respective one of said outputs.

* * * * *